United States Patent [19]

Svilans

[11] Patent Number: 4,675,876
[45] Date of Patent: Jun. 23, 1987

[54] BRAGG DISTRIBUTED FEEDBACK SURFACE EMITTING LASER

[75] Inventor: Mikelis N. Svilans, Kanata, Canada

[73] Assignee: Northern Telecom Limited, Montreal, Canada

[21] Appl. No.: 701,707

[22] Filed: Feb. 14, 1985

[51] Int. Cl.⁴ ............................................. H01S 3/19
[52] U.S. Cl. ....................................... 372/96; 357/17;
372/45; 372/46; 372/47
[58] Field of Search ....................... 372/44, 45, 46, 47,
372/96; 357/17

[56] References Cited
U.S. PATENT DOCUMENTS 3,703,670 11/1972 Kunz ...................................... 357/17
3,983,509 9/1976 Seifres et al. ........................... 372/96

Primary Examiner—James W. Davie
Attorney, Agent, or Firm—Schwartz, Jeffery, Schwaab, Mack, Blumenthal & Evans

[57] ABSTRACT

A surface-emitting, light emitting device has a columnar active region of one direct bandgap semiconductor and an adjacent confining region of higher bandgap semiconductor. Contacts are made to the active and confining regions and a window is formed in the device in vertical alignment with the active region to permit light emission from the device. The semiconductors are doped to establish a pn junction within a carrier diffusion length of the heterojunction between the active and confining regions, the pn junction extending the length of the active region. In use, laser light is emitted along the axis of the columnar active region in response to current passing across the pn junction. The active region is epitaxially grown with a compositional and refractive index periodicity causing Bragg distributed feedback (DFB) laser operation, the bandgap of the material of the confining region being higher than that of all the layers in the active region.

4 Claims, 1 Drawing Figure

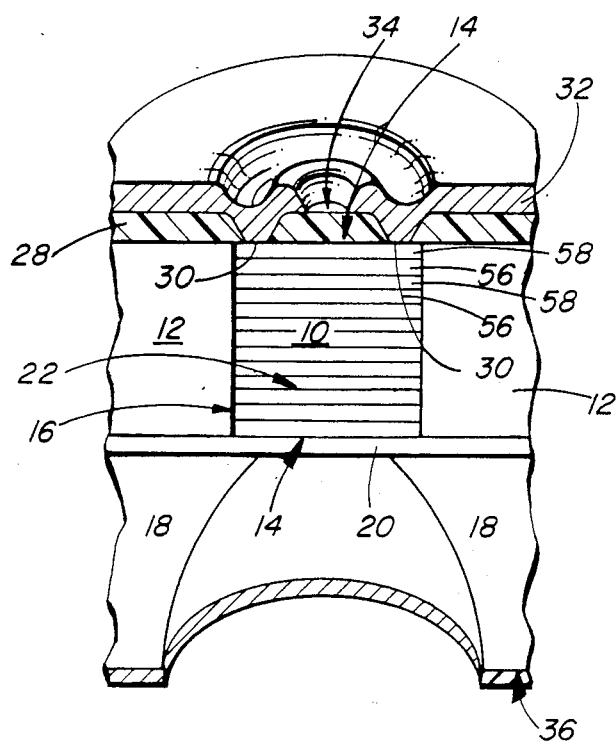

BRAGG DISTRIBUTED FEEDBACK SURFACE EMITTING LASER

BACKGROUND OF THE INVENTION

This invention relates to surface-emitting heterojunction laser/LED structures.

The importance of vertical laser emission for optoelectronic integration was recognized by, for example, K. Iga et al, 9th IEEE International Semiconductor Conference, 1984, Rio de Janeiro, Brazil, paper D3, p 52. Vertical laser emission is particularly important in constructing large emitting areas which can be made to have narrow beam angles and high power outputs. Several types of surface-emitting laser are known. Spring-Thorpe et al, International Electron Devices Meeting, (1977) Washington, D.C., p 571 discloses a standard double heterostructure cavity transverse to current flow. The cavity is electrically pumped over most of its length and two additional mirrors are used to divert the laser beam towards the device surface. K. Iga et al, Electronics Letters, 19, #13 (1983) p 457 disclose a surface-emitting laser having a cavity perpendicular to the surface but pumped over a short length of the cavity by a pn junction co-planar with the surface. Ito et al, Electronics Letters 20 #14 (1984) p 577, elaborate on the Iga structure by elongating the cavity and introducing additional pumping along its length by a diffused homojunction.

In my co-pending patent application Ser. No. 701,839 filed Feb. 10, 1985 there is described an alternative surface emitting device. The device has a columnar active region of one direct bandgap semiconductor and a surrounding confining region of a higher bandgap semiconductor. Contacts are made to the active and confining regions and a window is formed in the device in vertical alignment with the active region to permit light emission from the device. The semiconductors are doped to establish a pn junction within a carrier diffusion length of the heterojunction between the active and confining region, the pn junction extending the length of the active region. In use, light is emitted along the axis of the columnar active region in response to current passing radially across the pn junction.

Any of these surface emitting lasers can have an active region epitaxially grown to provide layers of varying composition and with layer thicknesses such that in operation distributed feedback is provided. If the feedback occurs within the active region, these devices are termed distributed feedback lasers (DFB), whereas outside the active region they are generally referred to as distributed Bragg reflectors (DBR), see for example, IEEE Spectrum December, 1983, page 43. Bragg distributed reflectors for surface emitting lasers are described by Ogura et al, "GaAs/Al$_x$Ga$_{1-x}$As Multilayer Reflector for Surface Emitting Laser Diode", Japanese Journal of Applied Physics, volume 22, No. 2, February 1983, pp. L112-L114, while by Ogura et al, "Distributed Feed Back Surface Emitting Laser Diode with Multilayered Heterostructure", Japanese Journal of Applied Physics, Volume 23, No. 7, July 1984, pp L512-L514 demonstrates the actual application to a laser device.

The Ogura et al laser device has multilayer semiconductors formed within the active region and at opposed ends of the active region. The Ogura et al device is constructed by fabricating a multilayer of GaAs and Ga$_{0.7}$Al$_{0.3}$As and then diffusing zinc laterally to establish a pn homojunction. The zinc diffusion acts to mix the GaAs and Ga$_{0.7}$Al$_{0.3}$As on one side of the homojunction. For layers of equal thickness, the composition obtained on mixing is Ga$_{0.85}$As$_{0.15}$As. This alloy has a bandgap which is lower than GaAs and higher than Ga$_{0.7}$Al$_{0.3}$As. However the pumping or injection efficiency of a laser is exponentially related to the bandgap difference at a heterojunction, current carriers being directed from the material of larger bandgap to the material of smaller bandgap. Consequently in Ogura et al only the alternate layers can be pumped and the maximum bandgap difference is limited by the high bandgap material on one side of the homojunction being mixed with a low bandgap material.

SUMMARY OF THE INVENTION

The present invention provides in a semiconductor laser, an active region and a confining region adjacent to the active region, the active region having a series of layers of changing composition and refractive index, the series of layers epitaxially related to one another and to the confining region, the layers in use to provide Bragg distributed optical feedback the improvement comprising the material of the confining region having a bandgap higher than the bandgaps of all of the layers in said active region.

BRIEF DESCRIPTION OF THE DRAWING

An embodiment of the invention will now be described by way of example with reference to the accompanying drawing which is a non-scalar, longitudinal sectional view of a Bragg distributed feedback surface emitting laser.

DETAILED DESCRIPTION OF THE PREFERRED EMBODIMENT

Referring to the FIGURE, there is shown a light emitting device having a direct bandgap III-V semiconductor material constituting a device active region 10 and a wider bandgap III-V semiconductor material constituting a device confining region 12. The material in the active region 10 is p-type and the material in the confining region 12 is n-type. The device active region is of columnar shape and above and below it are partially reflecting mirrors 14.

In use, current is directed into the columnar active region 10 across a cylindrical pn junction 16, and into the n-type wider bandgap confining material 12 by electrical contacts 32 and 36. Current passing across the pn junction generates current carriers which are injected into the active region 10 in an energized state. When the carriers subsequently return to their low energy state light is emitted. The carriers and light are retained within the cavity since the material of the active region 10 is of a lower bandgap and higher refractive index than the material of the confining region 12. The light is partially reflected at the opposed mirrors 14 thereby providing optical feedback. Supplementary feedback is also provided by wavelength dependent partial reflection occuring within the active region.

The device has an n$^+$-type GaAs 100 micron thick substrate 18 doped to a level of $2.10^{18}$ cm$^{-3}$. Epitaxially grown on an upper surface of the substrate is a 1 micron thick etch stop layer 20 of n-type Ga$_{1-x}$Al$_x$As (x=0.3) doped to a level of $1.10^{18}$ cm$^{-3}$. Alternating layers 56, 58 of p-type GaAs and Ga$_{0.95}$Al$_{0.05}$As doped to levels of $2.10^{17}$ cm$^{-3}$ are then epitaxially grown on the substrate to a depth of 20 microns. The layers are then etched to leave the column 10 of diameter 5 microns. Subsequently n-type $Ga_{0.65}Al_{0.35}As$ doped to a level of $2.10^{17}$ cm$^{-3}$ is epitaxially grown on the substrate 18 and around the column 10 to a thickness approximately equal to the column height whereby the column 10 and the surrounding region 12 of n-type GaAlAs form a layer of approximately uniform thickness.

Subsequently an insulating layer 28 of $SiO_2$ is low pressure chemically vapor deposited on the upper surface of the epitaxially grown material to a depth of 2000 angstrom units. An annular window 30 is etched through the insulator 28 to the column 10 near the pn junction and zinc is diffused through it into the column top surface. Subsequently a top contact 32 of Pt/Ti/Au is low pressure chemically vapor deposited through a mask onto the top surface of the wafer except over a 3 micron diameter central region 34. In addition, a 1500 angstrom unit layer 36 of Au/Ge is low pressure chemically vapor deposited on the lower surface of the substrate 18. Using a $H_2O_2:H_2SO_4:H_2O$ etchant, a well is formed by etching through the bottom contact layer 36 and into the substrate 18 to the etch stop layer 20. GaAs does not transmit light at 0.84 microns, the emission wavelength of the GaAs device so the well obviates undue absorption of light emitted from the active resgion.

An important mode of operation of semiconductor lasers is single frequency (or equivalently, single longitudinal mode) operation. In standard lasers, optical feedback is accomplished with semiconductor-air or semiconductor-insulator reflecting interfaces, at opposed ends of the active region, these interfaces being relatively insensitive to the light wavelength. Single longitudinal mode operation is enhanced in the present device by wavelength dependent feedback. Light within the active region is partially reflected at junctions between layers 56 and 58. The refractive index and thickness of the layers is so chosen that the partial reflections interfere constructively at a narrow band of wavelengths but not at wavelengths outside the band, according to the Bragg reflection principle.

In the illustrated device the Bragg distributed feedback property is introduced by the periodic compositional perturbations 56, 58 in the active region. Molecular beam epitaxy (MBE) or organometallic vapor phase epitaxy (OMVPE) are crystal growth techniques capable of the necessary sub-micron layer thickness control. Epitaxial growth conditions are adjusted so as to grow the active region as alternating layers 56, 58 of the narrow bandgap and wider bandgap materials, the compositional periodicity being of optical thickness $\lambda/2$ where $\lambda$ is the device output wavelength.

Since the bandgap of the confining material is higher than the bandgap of both the GaAs layers 58 and the $Ga_{0.95}Al_{0.05}As$ layers 56, current carriers are injected and electrically confined over the full length of the active region. There is also some secondary carrier injection from the higher bandgap layers into the lower bandgap layers at locations remote from the pn junction between the confining region and the active region. In effect there is a spreading of carriers to the centre of the active region by this mechanism.

As shown the bandgap difference at the pn heterojunction is close to the maximum permissible using the GaAs/GaAlAs ternary III-V system since the Al ratio in the confining region to active region is 0.95:0.05 or greater. The level of aluminum in the confining region 12 can however be reduced to lower the bandgap of the confining region material so long as it is not lowered to a level below that of the higher bandgap layers 56 in the active region i.e. as long as the bandgap of the confining region material is higher than that of the active region material over the complete heterojunction 16. Similarly, and particularly for lasers in the visible spectrum of the order of 0.75 microns output wavelength, the amount of aluminum in the layers 56, 58 of the active region 10 can be increased but only to a level below that in the confining region 12 so as to maintain high laser injection efficiency.

The nature of compositions and thicknesses of the alternating layers can be changed in accordance with known Bragg reflection theory to optimize optical gain, reflection, optical confinement and current confinement for devices of various dimensions.

Although the device shown in the FIGURE is based on the ternary GaAs/GaAlAs III-V system having an output wavelength of the order of 0.84 microns, the device can be fabricated in other semiconductor systems such as the InP/InGaAsP quaternary system or the group II-VI semiconductor material HgCdTe.

In the embodiment described the p-contact 32 is made to the top of the active region 10 and the n-contact 36 is made to the confining region at the substrate bottom surface. In an alternative contact scheme (not shown) the p and n contacts are made as spaced contacts to the wafer top surface.

What is claimed is:

1. In a distributed feedback laser, the combination comprising: an active region of a direct bandgap semiconductor material, a confining region of a higher bandgap semiconductor material adjacent the active region to form a heterojunction, the active region having a series of layers of changing composition and refractive index, the series of layers epitaxially related to one another and to the confining region, the layers functioning in use to provide Bragg distributed optical feedback, the material of the confining layer having a bandgap higher than the bandgap of the material of all the layers of the active region.

2. A surface-emitting laser as claimed in claim 1 in which the layers are formed of group III-V material containing at least two group III elements wherein the content ratio of the elements changes from layer to layer.

3. A surface-emitting laser as claimed in claim 1 in which the series of layers has a compositional periodicity of optical thickness $\lambda/2$ where $\lambda$ is the device output wavelength.

4. A surface emitting laser as claimed in claim 1 in which the active region is columnar, the confining region extends around at least a part of the active region and the laser emits along the axis of the columnar active region.

* * * * *